(12) United States Patent
Beuville et al.

(10) Patent No.: US 10,530,380 B2
(45) Date of Patent: Jan. 7, 2020

(54) MASSIVELY PARALLEL THREE DIMENSIONAL PER PIXEL SINGLE SLOPE ANALOG TO DIGITAL CONVERTER

(71) Applicant: RAYTHEON COMPANY, Waltham, MA (US)

(72) Inventors: Eric J. Beuville, Goleta, CA (US); Matthew T. Kuiken, Goleta, CA (US); Joshua J. Cantrell, Santa Barbara, CA (US); Mark A. Massie, Solvang, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/964,511

(22) Filed: Apr. 27, 2018

(65) Prior Publication Data

US 2019/0334541 A1    Oct. 31, 2019

(51) Int. Cl.
*H03M 1/14* (2006.01)
*H03M 1/12* (2006.01)
*H03M 1/56* (2006.01)

(52) U.S. Cl.
CPC ........... *H03M 1/144* (2013.01); *H03M 1/123* (2013.01); *H03M 1/56* (2013.01)

(58) Field of Classification Search
CPC ......... H03M 1/144; H03M 1/56; H03M 1/123
USPC ................................... 341/169, 164
See application file for complete search history.

(56) References Cited

U.S. PATENT DOCUMENTS

| 7,924,207 | B2 |   | 4/2011 | Snoeij et al. |
| 8,723,998 | B2 | * | 5/2014 | Maruta ................... H04N 5/374 341/164 |
| 9,312,842 | B2 | * | 4/2016 | Rysinski .............. H03F 3/45188 |
| 9,967,496 | B2 | * | 5/2018 | Ayers .................. H04N 5/37452 |
| 10,205,463 | B1 | * | 2/2019 | Milkov .................... H03M 1/56 |

* cited by examiner

*Primary Examiner* — Brian K Young
(74) *Attorney, Agent, or Firm* — Cantor Colburn LLP

(57) ABSTRACT

An image detector includes an array of detector unit cells including a plurality of unit cells and a plurality of single slope analog to digital converters (SSADCs). Each of the plurality of SSADCs is coupled to an output of a different one of the unit cells. Each each of the plurality of SSADCs includes: a comparator having a positive input and a negative input and a comparator output, the comparator being contained in a first layer; and a counter coupled to the comparator output and contained in a second layer. The counter is electrically coupled to the comparator with a through a silicon via.

18 Claims, 4 Drawing Sheets

MASSIVELY PARALLEL THREE DIMENSIONAL PER PIXEL SINGLE SLOPE ANALOG TO DIGITAL CONVERTER

GOVERNMENT LICENSE RIGHTS

This invention was made with Government support under HR0011-17-C-0064 awarded by Department of Defense. The Government has certain rights in the invention.

BACKGROUND

The present disclosure relates to an analog-to-digital converter (ADC) and, in particular to a massively parallel single slope ADC (SS-ADC).

Over the last few years, electro-optical sensors have been developed that incorporate increasingly higher resolution. Such detectors may have different operations modes or settings that need to be stored or altered.

In particular, such sensors may include an ADC comprised of a read-out integrated circuit (ROIC), a counter and a latch that stores a counter value related to the input to the sensors, such as pixels. In more detail, conventional SS-ADC designs use a ROIC that has a comparator output that is connected to a counter memory element (e.g., a latch) to cause a counter value to be stored into the memory element. In a read-while-integrating type of ROIC, a storage capacitor is periodically charged for a predetermined amount of time. After this time, a ramp voltage is combined with the voltage on the storage capacitor. A comparator compares the increasing voltage across the capacitor to a reference voltage and when the voltage across the capacitor increases above the reference voltage threshold, the output of the comparator changes state or can output a pulse depending on configuration.

A greycode counter begins counting and counts up as the ramp voltage increases. The other input to the comparator is the analog value that needs to be converted to a digital value. A latch or other memory device receives the pulse from the comparator and this causes the greycode counter value to be stored in the latch. Such circuits generally work for their intended purposes but as discussed more fully below, such circuits may have drawbacks when used in low power environments.

The analog-to-digital conversion in ROIC's for imaging applications is usually done at the column level which limits the maximum frame rate achievable. One (or two) row of pixels is converted at the same time. Full frame conversion requires a number of row times dependent of the array size, therefore limiting maximum full frame (further reduced for larger array sizes). That is, the time it takes for a full frame conversion increases as the size of the array is increased.

SUMMARY

According to one embodiment, a single slope analog to digital converter (ADC) is disclosed. The SSADC includes a comparator having a positive input and a negative input and a comparator output, the comparator being contained in a first layer and a counter coupled to the comparator output and contained in a second layer formed by a non-ITAR compliant process and that is below the first level. The counter is electrically coupled to the comparator with a through a silicon via.

According to another embodiment, a method of forming a single slope analog to digital converter (ADC) is disclosed. The method includes: forming a comparator having a positive input and a negative input and a comparator output in a first layer; forming a counter coupled to the comparator output and contained in a second layer; and electrically coupling the counter and the comparator with a through silicon via.

According to another embodiment, an image detector comprising that includes an array of detector unit cells including a plurality of unit cells is disclosed. The detector also includes a plurality of single slope analog to digital converters (SSADCs), each of the plurality of SSADCs coupled to an output of a different one of the unit cells. In this embodiment, each of the plurality of SSADCs includes: a comparator having a positive input and a negative input and a comparator output, the comparator being contained in a first layer; and a counter coupled to the comparator output and contained in a second layer. In this embodiment, the counter is electrically coupled to the comparator with a through a silicon via.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be discussed below, each pixel includes its own SS-ADC. In one embodiment, the SS-ADC is split into two portions, a read out integrated circuit (ROIC) and a signal processing portion. The two portions are formed in different device layers. The ROIC is contained in a first layer and the signal processing portion is contained in a second layer. In one embodiment, the first layer is disposed on top of the second layer and the components in the two layers are electrically connected to each other using a through silicon via (TSV). In one embodiment, the first and second layers are physically connected to one another by direct bond integration (DBI).

Figure 1:
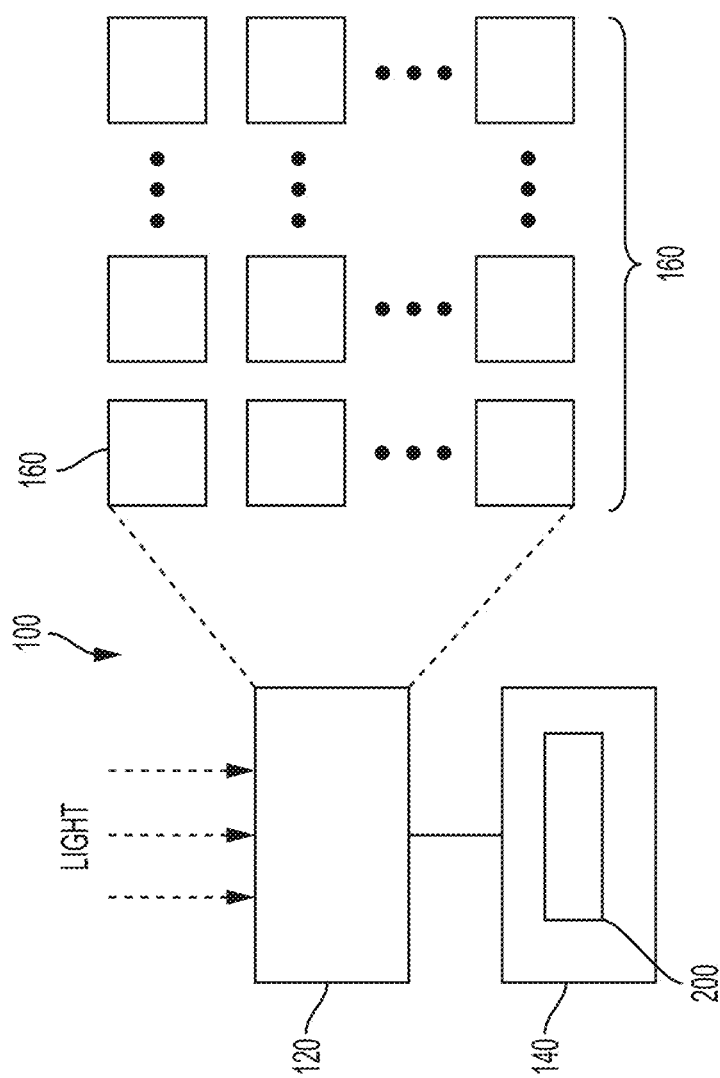
FIG. 1 is a schematic diagram illustrating an image detector in accordance with embodiments.

FIG. 1 is a schematic diagram illustrating an image detector 100 in accordance with embodiments. Such a detector 100 may be deployed, for example, on a satellite or other airborne apparatus such as an aircraft or any land- or sea-based tactical application in which it is a requirement that frame rate not be limited by array size. Image detector 100 may be a focal plane array (FPA), active pixel sensor (APS) or any other suitable energy wavelength sensing device. The image detector 100 may be used as a component of a photographic and/or image capturing device, such as a digital camera, video camera or other similar device. The image detector 100 may include a detection device 120 and an analog-to-digital converter (ADC) 140.

The detection device 120 includes an array of photosensitive/energy wavelength sensitive detector unit cells 160 arranged in an X×Y matrix. Each of the detector unit cells 160 may accumulate charge or produce a current and/or voltage in response to light incident upon the detector unit cell 160 and may correspond to a pixel in a captured electronic image. One or more of the detector unit cells 160 may include a photovoltaic detector (e.g., a photovoltaic single absorber detector or a photovoltaic multi-absorber (multi-junction) detector), a barrier device detector, a position sensitive detector (PSD) or other suitable detector.

The ADC 140 may be used for processing of the incident light (e.g., to create an image representative of the incident light). For example, the ADC 140 interfaces with the detection device 120 to receive a signal, such as the accumulated charge or the current and/or voltage produced in response to light incident upon the detector unit cells 160. In one embodiment, a read out integrated circuit (ROIC) 200 is provided that accumulates voltage/current and produces a digital output when a threshold is crossed. The digital output can be used to cause a counter to be interrupted or the value to be stored in a latch. The counter value corresponds to the signal receive by the units cells 160.

The ADC 140 may include an array of ADC unit cells that are arranged in an X×Y matrix corresponding to the orientation of the X×Y matrix of the detector unit cells 160. Thus, each ADC unit cell may be interconnected with a corresponding detector unit cell 160 by way of one or more direct bond interconnects, such as direct metal-to-metal interconnects or indium interconnects.

In prior art systems, analog to digital conversion for imaging applications is usually done at the column level. One row (or up to two rows) of pixels is converted at the same time. For example, for 1024 rows, up to 1024 row times will be necessary to convert the entire array. Table 1 shows the conversion times for an ADC per eight columns array having the specified number of rows when using a 14-bit ADC with 2 megasamples per second (MSPS) per eight columns:

TABLE 1

| Array Size (rows) | Conversion time 14 bit ADC (2 MSPS) 1 ADC per 8 columns | Max Frame rate (IWR) |
|---|---|---|
| 1024 | 4.096 ms | 240 Hz |
| 2048 | 8.2 ms | 120 Hz |
| 4096 | 16.4 ms | 60 Hz |

Maximum full frame rate is limited by the ADC conversion time and depends on the array size as can be seen in Table 1.

In one embodiment herein, each unit cell 160 is connected to a unique ADC 140. This allows all pixels to be read substantially simultaneously. The can result in the conversion times shown below to table 2:

TABLE 2

| Max Full Frame rate 16 bit SSADC 100 Hz (conversion time) | Max Full Frame rate 14 bit SSADC 100 MHz (conversion time) |
|---|---|
| 1.52 kHz (656 us) | 6.1 kHz (164 us) |

In one embodiment, the unit cell 160 is on one level and the ADC 140 is separated onto two separate fabrication levels as will be fully described below.

Figure 2:
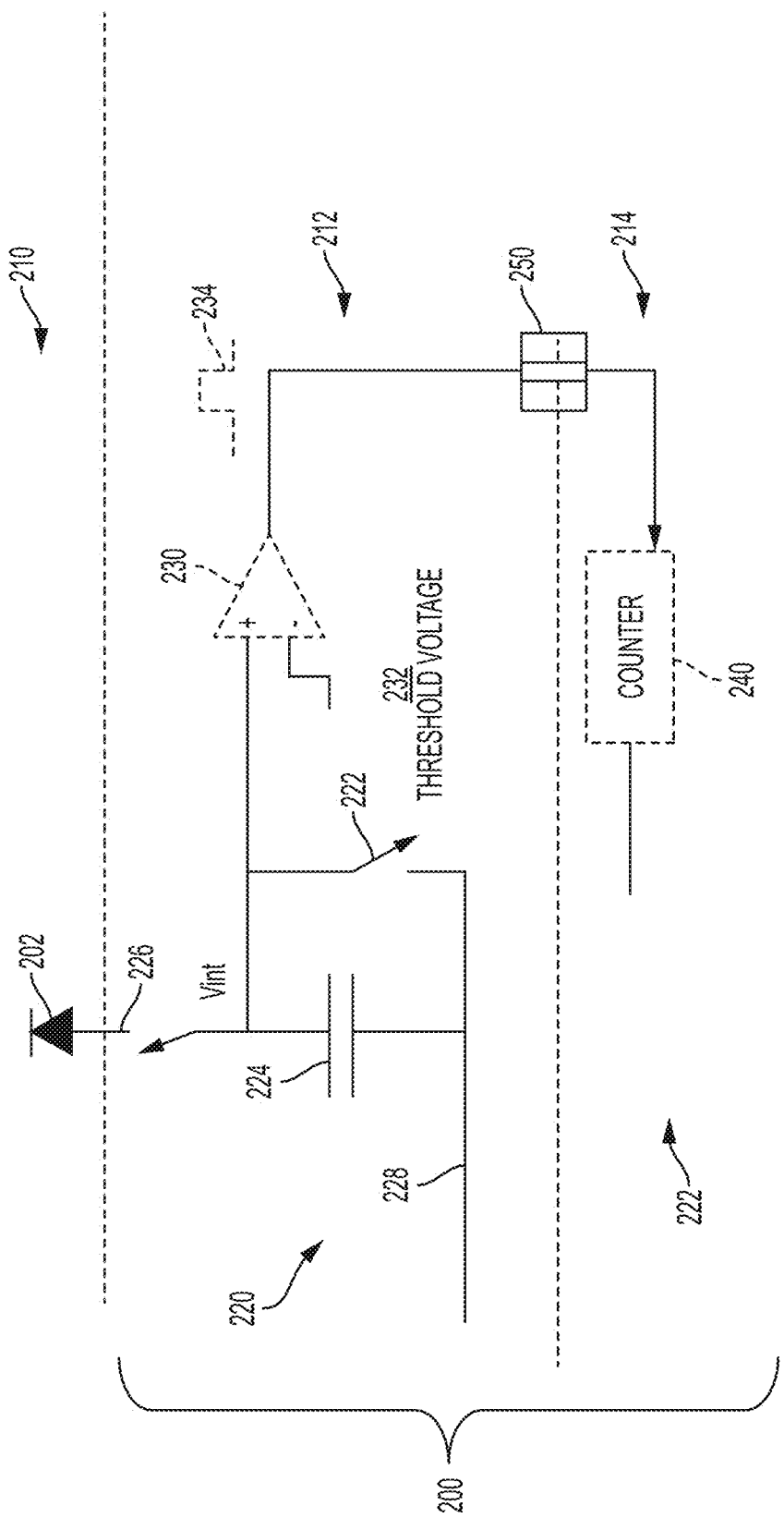
FIG. 2 is a schematic diagram illustrating an SS-ADC according to one embodiment.

FIG. 2 illustrates an example SS-ADC 140 that may be used to read values from two different voltage sources, such as, for example, two different pixels or unit cells 160. In general, a combination of a stored (e.g., integrated) voltage for an individual pixel and a ramp voltage is applied to a comparator and when the combined voltage exceeds a threshold voltage, the comparator changes state (in this case, from low to high). The change in state can be used to cause a counter to stop counting. The ramp voltage linearly increases with time. As such, there is a linear relationship between the counter value and stored voltage. In this manner, the voltage input to the comparator (as opposed to the ramp voltage) is converted from an analog value to a digital value.

Figure 3:
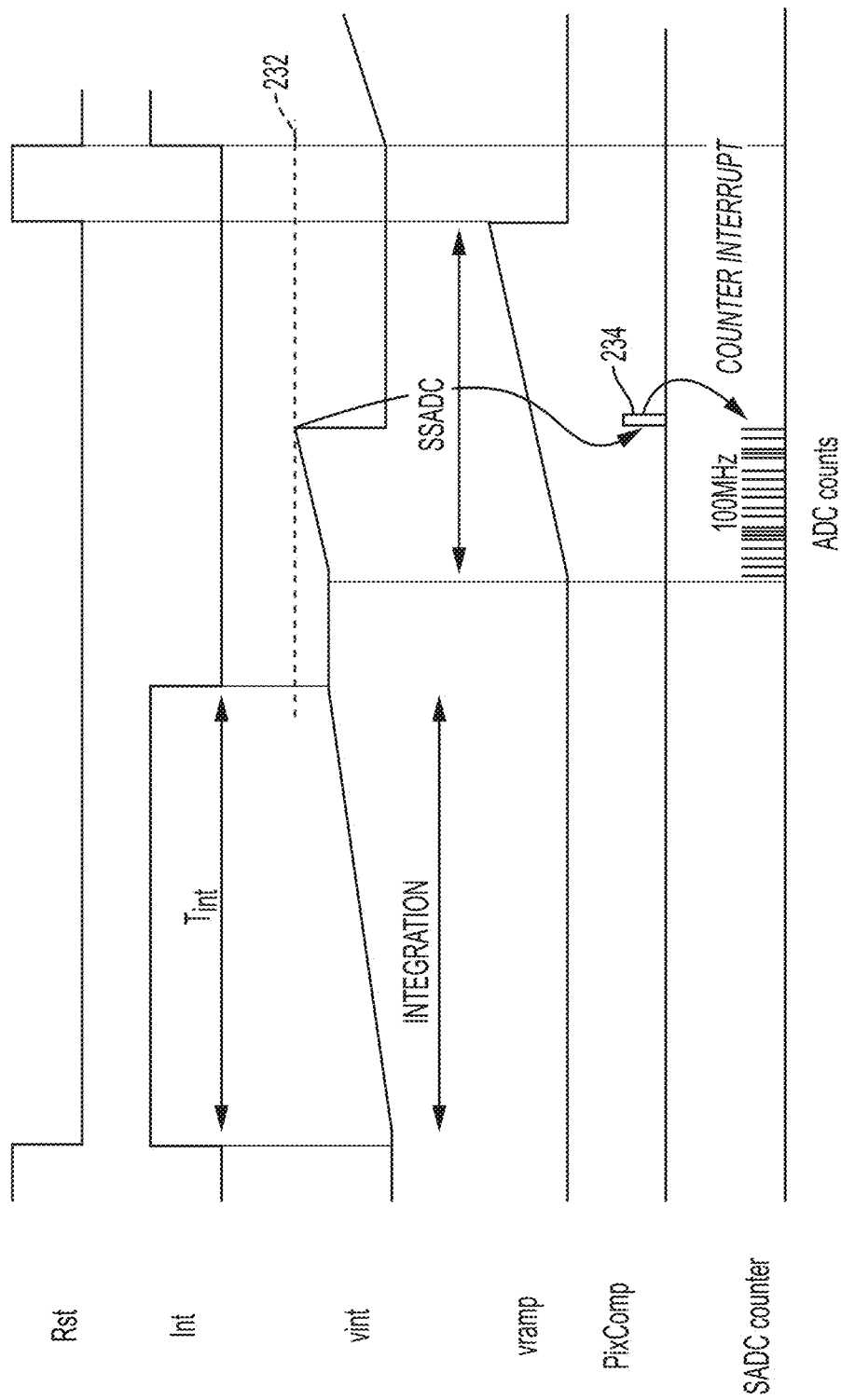
FIG. 3 shows a timing diagram during operation of the SS-ADC of FIG. 2.

In more detail and with reference to FIGS. 2 and 3, for each unit cell such as pixel 202, a unique SS-ADC 200 is provided. The SS-ACD 200 includes ROIC 220 and signal processing portion 222. The signal processing portion 222 includes at least a counter 240. In one embodiment, the counter 240 is a grey counter. Gray code is a binary numeral system where two successive values differ in only one bit (binary digit). Of course, the counter 240 could utilize other digital counting schemes. The number of bits of such a counter is variable but, in one embodiment is 16 bits and in another is 14 bits.

As will be understood, the counter 240 and the ROIC 220 may share a common reset to ensure that they are synchronized. The reset signal will reset the ROIC by opening reset switch 222.

The ROIC 220 includes an integration capacitor 224 that can be selectively coupled to pixel 202 by integration switch 226. The integration capacitor 224 is connected between the integration switch 226 and a reference line 228. One plate (e.g., one side) of the integration capacitor 224 is connected to an input to comparator 230. The other input to the comparator 230 is connected to a threshold voltage 232.

In operation, during an integration window shown as time $T_{int}$ in FIG. 3, the integration switch 226 is closed and the reset switch 222 is open. During that time, the voltage across the integration capacitor 224 ($v_{int}$) due to its connection to pixel 202 builds. After time $T_{int}$ expires, the integration switch 226 is opened. The integrated value is then read out as describe more fully below. As such, the circuit forming the ROIC 220 in FIG. 2 can be considered an integration then read type of ROIC.

After the integration switch 226 has been opened, a voltage ramp is generated ($v_{ramp}$) in FIG. 3 and injected on the bottom plate (e.g. reference line 228) of the integration capacitor 224. While each pixel 202 in the array includes its own ADC, 200, it shall be understood that any of the reset signal (Rst), the integration signal (Int) and the ramp signal ($v_{ramp}$) can be system wide signals. Also, when $v_{ramp}$ starts, the counter 240 is started.

The injection of $v_{ramp}$ causes $v_{int}$ to rise. The comparator 230 changes output state when $v_{int}$ exceeds a threshold voltage 232. The comparator includes a positive input (+) connected to $v_{int}$ and a negative input (−) connected to a threshold voltage 232. The change in state (shown by pulse 234) interrupts counter 240. As before, the ramp voltage linearly increases with time. As such, there is a linear relationship between the counter value and stored voltage. In this manner, the voltage provided to the positive (+) input of the comparator 230 (as opposed to the ramp voltage) is converted from an analog value to a digital value represented by value of counter 240. Further, while the shape of the change in state of the output of comparator 230 is shown as a pulse in FIGS. 2 and 3, it could be a constant value (e.g., a change from a 0 to a 1) until the ROIC 220 is reset. The reset can happen by closing reset switch while Rst (FIG. 3) is held high.

It will be understood that $V_{int}$ can either continue to rise after exceeding the threshold voltage 232 or can be reset to zero as shown in FIG. 3 as will be understood by the skilled artisan.

In an alternative embodiment, the counter value can be stored in a latch rather than generating an interrupt to the counter when the state of the comparator 230 changes.

In one embodiment, the SSADC 200 is implemented as per pixel using heterogeneous 3D wafer stacking for imaging applications. The ROIC is implemented in a first layer 212. In one embodiment, the first layer 212 can be formed by an 180 nm process. A 180 nm process is a well known semiconductor process technology and is ITAR compliant. A layer or other element formed by a particular processes can also be referred to as a process node that identifies the particular process. For example, a layer or layer having an element formed therein formed by an 180 nm process can be referred to as a 180 nm node.

The counter 240 can be formed in a second, lower layer 214. The second layer 214 can be a formed by a 65 nm (or lower) process node. A 65 nm process is an advanced semiconductor fabrication process and may not need to be ITAR compliant.

The second lower layer 214 can include other signal processing elements not shown in FIG. 2 as well such as a controller for opening and closing the integration switch 226, the reset switch 222 and resetting the counter 240. The first and second layers 212, 214 are electrically connected to one another using a through silicon via 250.

In one embodiment, the first and second layers are 3D stacked using direct bond integration (DBI). DBI is wafer bonding process.

In view of the above, disclosed is massively parallel ADC per-pixel conversion that enables ultra-high frame rate independent of the array size. All pixel conversion is done in parallel reducing significantly the total conversion time, e.g., for a 16-bit counter at 100 MHz, conversion time is 656 µs for the entire array, independently of the array size. Very fast frame rates, i.e. 1.5 kHz, can be achieved independently of the array size. As another example, for a 14-bit counter at 100 MHz, conversion time is 164 µs for the entire array, independently of the array size, achieving 6.1 kHz frame rate.

In one embodiment, a More-than-Moore heterogeneous 3D integration that combines an imaging front-end ROIC with smaller node digital processing is disclosed. Each pixel's signal is converted locally in the first layer 212 with the SS-ADC grey-code counter, digital signal processing, etc. implemented in the second layer 214. Of course, the pixel(s) 202 can be contained in a separate sensor layer 210 in one embodiment.

Figure 4:
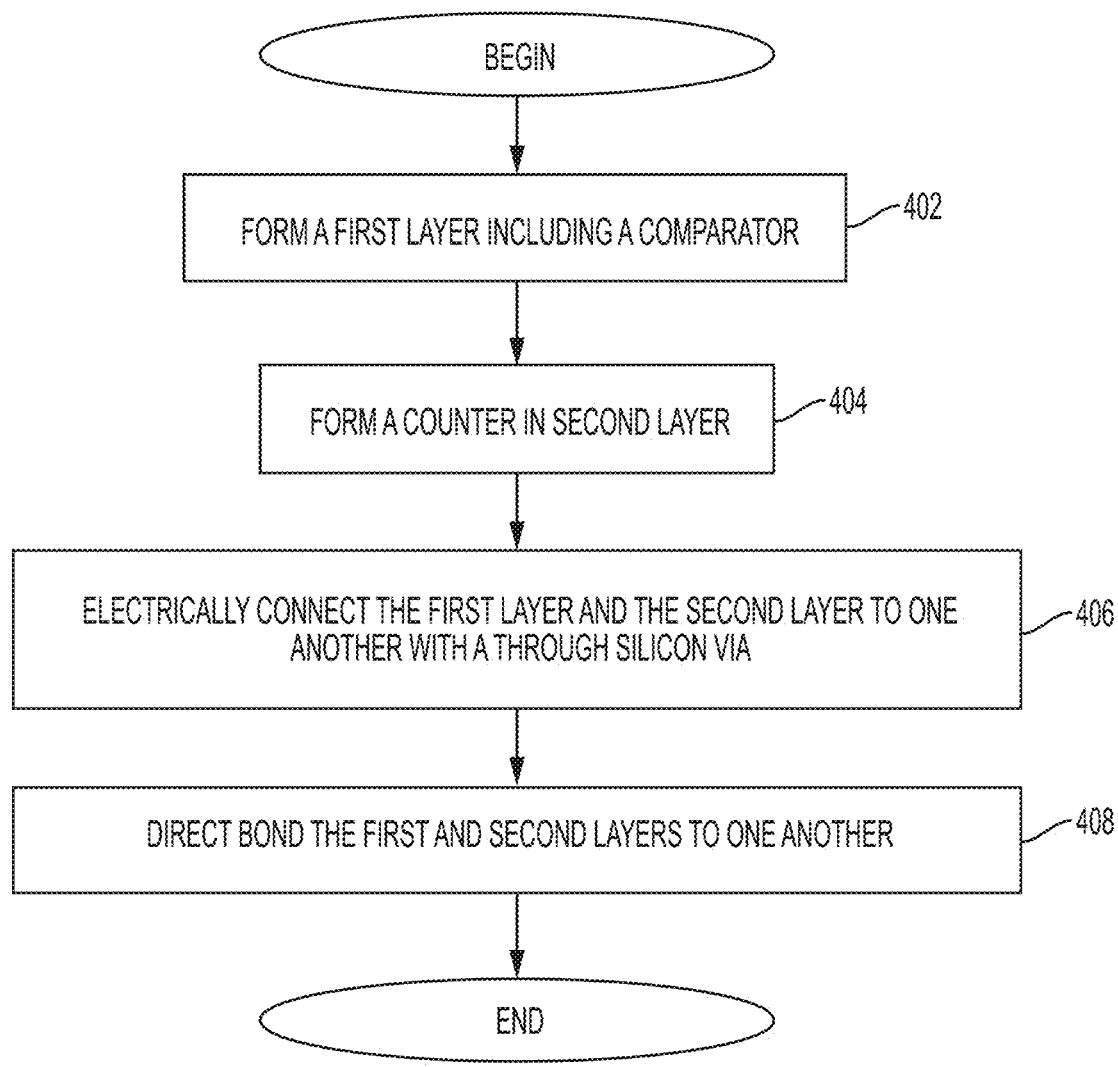
FIG. 4 is a flow chart of method of forming an SS-ADC according to the one embodiment.

In one embodiment, a method of forming a SS-ADC is disclosed. The method includes, and with reference to FIG. 4, forming a first layer including a comparator (block 402) and forming a counter in second layer (block 404). The first layer and the second layer can be electrically connected to one another with a through silicon via (block 406) and directed bonded to one another (block 408).

In one embodiment, any of the elements shown in layer 212 of FIG. 2 can be formed in the process of block 402. In such an embodiment, the elements can be connected as shown in FIG. 2.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A single slope analog to digital converter (ADC) comprising:
    a comparator having a positive input and a negative input and a comparator output, the comparator being contained in a first layer;
    a counter coupled to the comparator output and contained in a second layer formed by a non-ITAR compliant process and that is below the first level;
    wherein the counter is electrically coupled to the comparator with a through silicon via.

2. The single slope ADC of claim 1, wherein the first layer and the second level are formed using different semiconductor process nodes.

3. The single slope ADC of claim 2, wherein the first level is formed by an ITAR 180 nm or 90 nm process node.

4. The single slope ADC of claim 3, wherein the second level is formed by a non-ITAR 65 nm or lower process node.

5. The single slope ADC of claim 1, further including an integration capacitor coupled to the positive input of the comparator and included in the first layer.

6. The single slope ADC of claim 1, wherein the first layer is physically connected to the second layer by a direct wafer bond formed by direct bond integration.

7. A method of forming a single slope analog to digital converter (ADC) comprising:
    forming a comparator having a positive input and a negative input and a comparator output in a first layer;
    forming a counter coupled to the comparator output and contained in a second layer; and
    electrically coupling the counter and the comparator with a through silicon via;
    wherein the first layer and the second level are formed using different semiconductor processing processes.

8. The method of claim 7, wherein the first level is formed by an ITAR 180 nm or 90 nm process.

9. The method of claim 8, wherein the second level is formed by an non-ITAR 65 nm or lower process.

10. The method of claim 7, further including forming an integration capacitor coupled to an input of the comparator in the first layer.

11. The method of claim 7, further comprising physically connecting the first layer to the second layer by a direct wafer bond formed by direct bond integration.

12. An image detector comprising:
an array of detector unit cells including a plurality of unit cells; and
a plurality of single slope analog to digital converters (SSADCs), each of the plurality of SSADCs coupled to an output of a different one of the unit cells, wherein each of the plurality of SSADCs includes:
a comparator having a positive input and a negative input and a comparator output, the comparator being contained in a first layer; and
a counter coupled to the comparator output and contained in a second layer;
wherein the counter is electrically coupled to the comparator with a through silicon via.

13. The image detector of claim 12, wherein the first layer and the second level are formed using different semiconductor process nodes.

14. The image detector of claim 13, wherein the first level is formed by an ITAR 180 nm or 90 nm process node.

15. The image detector of claim 14, wherein the second level is formed by a non-ITAR 65 nm or lower process node.

16. The image detector of claim 12, wherein each of the plurality of SSADCs further includes an integration capacitor coupled to the positive input of the comparator and included in the first layer.

17. The image detector of claim 12, wherein the first layer is physically connected to the second layer by a direct wafer bond formed by direct bond integration.

18. A method of forming a single slope analog to digital converter (ADC) comprising:
forming a comparator having a positive input and a negative input and a comparator output in a first layer;
forming a counter coupled to the comparator output and contained in a second layer;
electrically coupling the counter and the comparator with a through silicon via; and
physically connecting the first layer to the second layer by a direct wafer bond formed by direct bond integration.

* * * * *